United States Patent
Tsai et al.

(10) Patent No.: US 7,514,713 B2
(45) Date of Patent: Apr. 7, 2009

(54) LIQUID CRYSTAL DISPLAY PANEL

(75) Inventors: Shu-Fen Tsai, Hsinchu (TW); Chen-Yu Tu, Hsinchu (TW); Jen-Wen Wan, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 161 days.

(21) Appl. No.: 11/612,488

(22) Filed: Dec. 19, 2006

(65) Prior Publication Data

US 2008/0067510 A1    Mar. 20, 2008

(30) Foreign Application Priority Data

Sep. 20, 2006    (TW) ............................. 95134754 A (51) Int. Cl.
*H01L 23/62* (2006.01)
*H01L 27/13* (2006.01)

(52) U.S. Cl. ..................... 257/59; 257/208; 257/359; 257/E27.113

(58) Field of Classification Search ............... 257/59, 257/72, 359

See application file for complete search history.

(56) References Cited

U.S. PATENT DOCUMENTS 6,521,940 B1 * 2/2003 Vu et al. ................ 257/315
6,930,742 B2   8/2005 Lee et al.
6,967,703 B2   11/2005 Nam et al.
2002/0089634 A1 * 7/2002 Aruga et al. ............ 349/149
2004/0263765 A1   12/2004 Han et al.
2005/0121672 A1 * 6/2005 Yamazaki et al. ........ 257/59

* cited by examiner

*Primary Examiner*—Marcos D Pizarro
*Assistant Examiner*—Tifney L Skyles
(74) *Attorney, Agent, or Firm*—Jianq Chyun IP Office (57) ABSTRACT

A liquid crystal display panel including an active device array substrate, a second substrate, a sealant, and a liquid crystal layer is provided. The active device array substrate has a display area and a peripheral area surrounding the display area, and includes a first substrate, pixels, signal lines, floating lines, and a common circuit layer. The signal lines are electrically connected with the pixels. The floating lines are disposed in fan-out areas of the peripheral area. Each of the floating lines is aligned with one of the signal lines respectively. The common circuit layer is disposed on an area of the peripheral area outside the fan-out areas. An overall thickness of the floating line and the signal line aligned therewith is equal to a thickness of the common circuit layer. The sealant covers the floating lines, a part of the signal lines and the common circuit layer.

11 Claims, 6 Drawing Sheets

LIQUID CRYSTAL DISPLAY PANEL

CROSS-REFERENCE TO RELATED APPLICATION

This application claims the priority benefit of Taiwan application serial no. 95134754, filed on Sep. 20, 2006. All disclosure of the Taiwan application is incorporated herein by reference.

BACKGROUND OF THE INVENTION

1. Field of Invention

The present invention relates to a liquid crystal display panel (LCD panel). More particularly, the present invention relates to an LCD panel capable of preventing mura.

2. Description of Related Art

From the first appearance of monochromatic TV sets working with cathode ray tubes (CRT), a tremendous progress has been made to the display technology. However, as displays working with the CRT have disadvantages of being large, heavy, high radiation, and low display quality, new flat display techniques have been developed successively. Among these flat display techniques, the liquid crystal display (LCD) technique is mature and popularized because of the advantages of being light, thin, short, and small, power saving, radiation free, full color, and convenient to carry. The LCD technique has been widely used in mobile phones, translation machines, digital cameras, digital video cameras, PDAs, laptop computers, and even desktop displays.

Generally speaking, an LCD displays images by adjusting the transmittance of liquid crystal cells of the LCD panel according to image signals. The LCD panel mainly includes a TFT array substrate, a color filter substrate, a liquid crystal layer, and a sealant. At least a plurality of pixels, various signal lines, and a common circuit layer are disposed on the TFT array substrate. The sealant is disposed between two substrates, so as to surround the liquid crystal layer and cover a part of the signal lines and the common circuit layer.

In order to reduce the impedance of the signal lines or the common circuit layer, the signal lines or the common circuit layer may include two metal film layers electrically connected with each other, or sometimes only one film layer. If the signal lines include a metal film layer and the common circuit layer includes two metal film layers, the thickness of the signal lines is different from that of the common circuit layer. As the signal lines and the common circuit layer have different thickness, the thickness of the sealant is different in different regions, which causes different cell gaps. Under this circumstance, curtain mura occurs around a display area of the LCD panel. On the contrary, if the signal lines include two metal film layers and the common circuit layer includes one metal film layer, the similar problem also occurs.

As described above, the signal lines or the common circuit layer can include two metal film layers electrically connected with each other, and the conductive materials of the two metal film layers are electrically connected together via structures such as contacts. However, electrostatic discharge (ESD) usually occurs at positions of the contacts. Therefore, designers of LCD panels should improve the structure of the signal lines.

SUMMARY OF THE INVENTION

The present invention is directed to provide an LCD panel for eliminating curtain mura and preventing ESD of signal lines.

In order to achieve the aforementioned or other objectives, the present invention provides an LCD panel including an active device array substrate, a second substrate, a sealant, and a liquid crystal layer. The active device array substrate has a display area and a peripheral area surrounding the display area. The active device array substrate includes a first substrate, a plurality of pixels, a plurality of signal lines, a plurality of floating lines, and a common circuit layer. The pixels are arranged on the first substrate in an array, and are located in the display area. The signal lines are electrically connected with the pixels, wherein the signal lines extend from the display area to a plurality of fan-out areas of the peripheral area. The floating lines are disposed in the fan-out areas, wherein each of the floating lines is aligned with one of the signal lines respectively. The common circuit layer is disposed on an area of the peripheral area outside the fan-out areas, and an overall thickness of the floating line and the signal line aligned therewith is equal to a thickness of the common circuit layer. The second substrate is disposed above the active device array substrate. The sealant is bonded between the active device array substrate and the second substrate, wherein the sealant covers the floating lines surrounding the display area, a partial area of the signal lines, and a partial area of the common circuit layer. The liquid crystal layer is disposed between the active device array substrate and the second substrate, and is located in the sealant.

In an embodiment of the present invention, the fan-out areas are scattered in the peripheral area and are located around the display area, and a part of the common circuit layer is disposed between every two neighboring fan-out areas.

In an embodiment of the present invention, the fan-out areas include a plurality of scan line fan-out areas and a plurality of data line fan-out areas, and the signal lines include a plurality of scan lines extending from the display area to the scan line fan-out areas and a plurality of data lines extending from the display area to the data line fan-out areas.

In an embodiment of the present invention, the scan line fan-out areas and the data line fan-out areas are located on two neighboring sides of the display area.

In an embodiment of the present invention, a part of the floating lines is located between the scan lines and the sealant, and the other floating lines are located between the data lines and the first substrate.

In an embodiment of the present invention, a part of the floating lines located in the scan line fan-out areas and the data lines belong to a same film layer, and a part of the floating lines located in the data line fan-out areas and the scan lines belong to a same film layer.

In an embodiment of the present invention, the common circuit layer includes a first and a second circuit layers. The first circuit layer and the scan lines belong to a same film layer, the second circuit layer is electrically connected with a part of the first circuit layer, and the second circuit layer and the data lines belong to a same film layer.

In an embodiment of the present invention, the floating lines are located between the signal lines and the sealant.

In an embodiment of the present invention, the floating lines are located between the signal lines and the first substrate.

In an embodiment of the present invention, the active device array substrate further includes an insulating layer disposed between the signal lines and the floating lines.

In an embodiment of the present invention, the active device array substrate further includes a passivation layer covering the signal lines and the floating lines.

As the overall thickness of the floating lines and the signal lines aligned therewith is equal to the thickness of the common circuit layer, the LCD panel of the present invention can prevent the curtain mura. Moreover, the floating lines are not electrically connected with the signal lines via the contacts, so the structure that often leads to ESD is not used. This feature of the prevent invention prevents the ESD occurring at specific positions of the signal lines.

In order to make the aforementioned and other objects, features and advantages of the present invention comprehensible, embodiments accompanied with figures are described in detail below.

DESCRIPTION OF EMBODIMENTS

Figure 1:
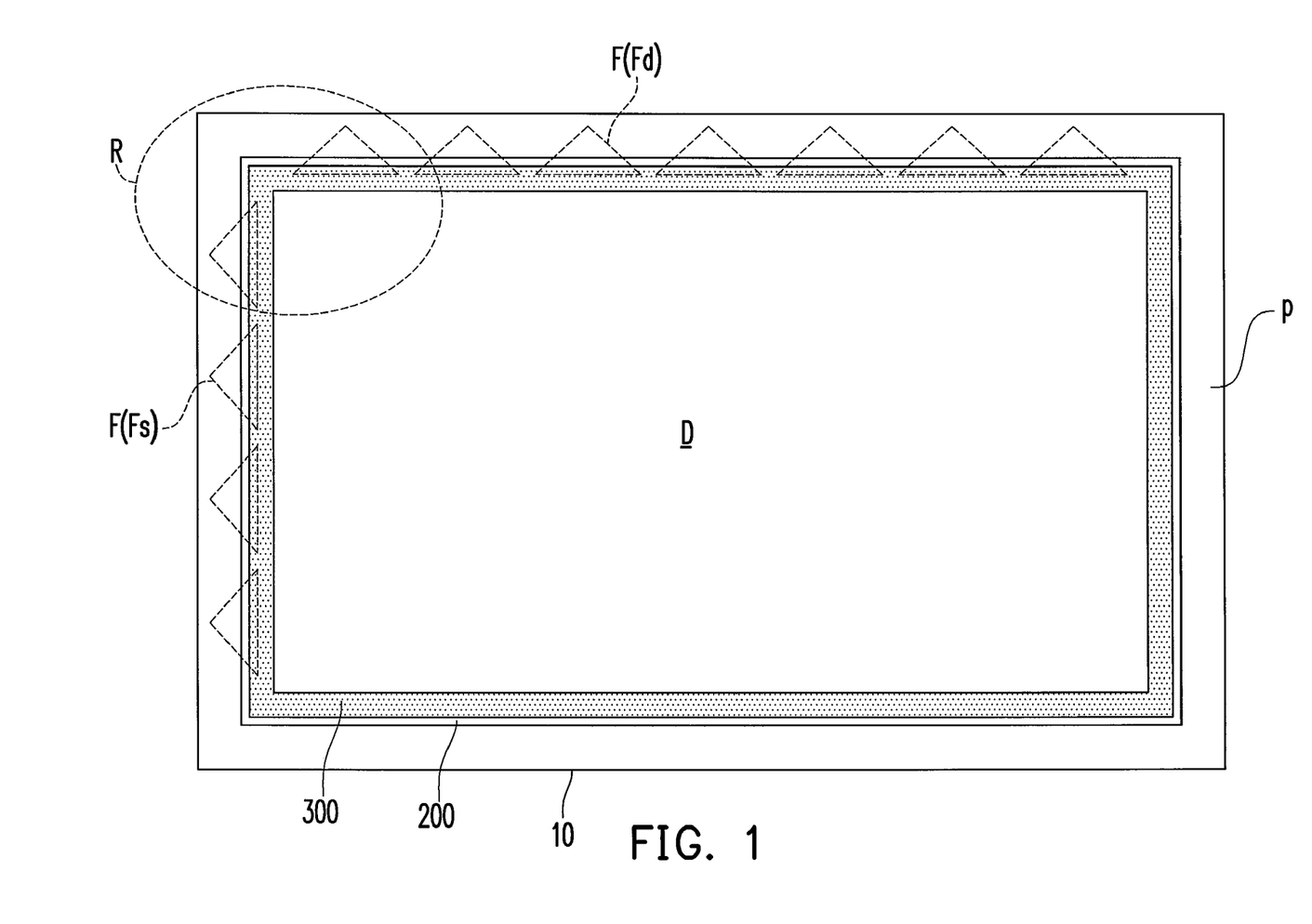
FIG. 1 is a top view of an LCD panel of an embodiment of the present invention.

FIG. 1 is a top view of an LCD panel of an embodiment of the present invention.

Figure 2:
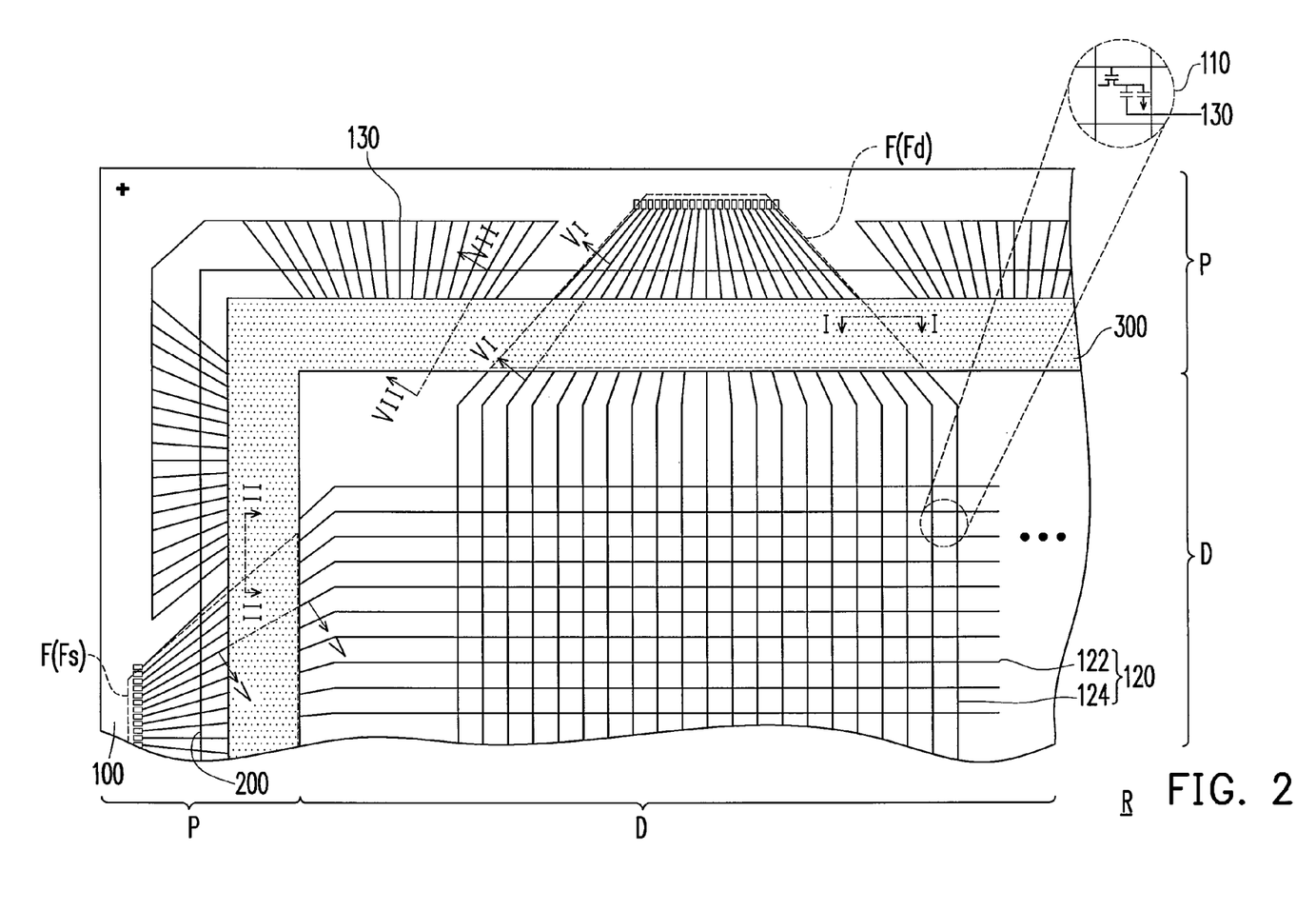
FIG. 2 is an enlarged view of the marked region R in FIG. 1.
Figure 3:
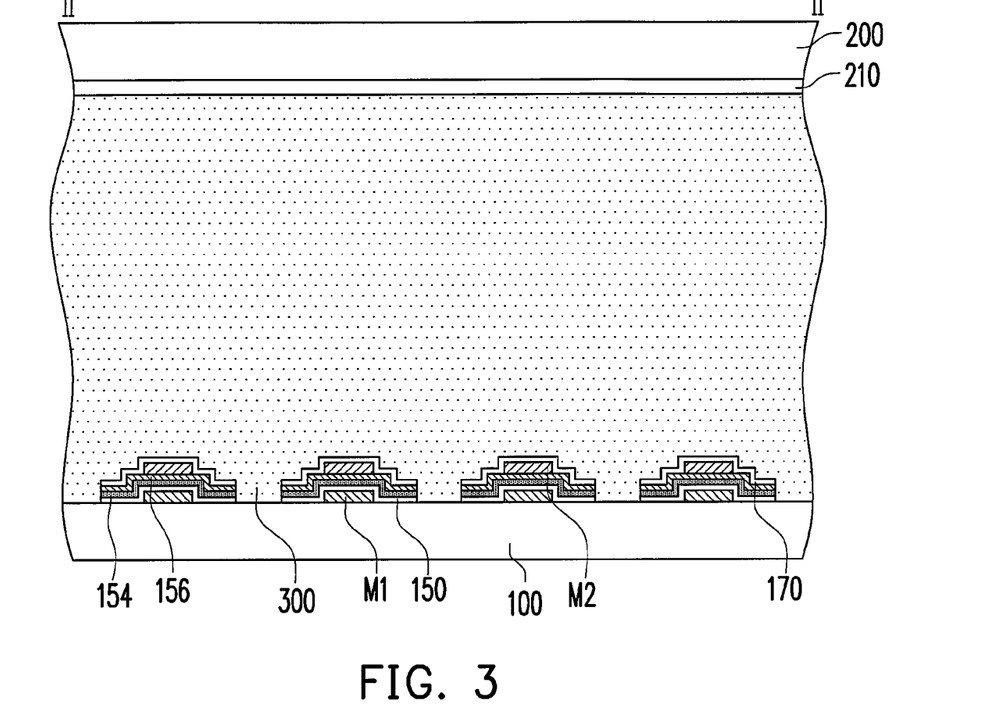
FIG. 3 is a sectional view taken along the section line I-I or II-II in FIG. 2.
Figure 4:
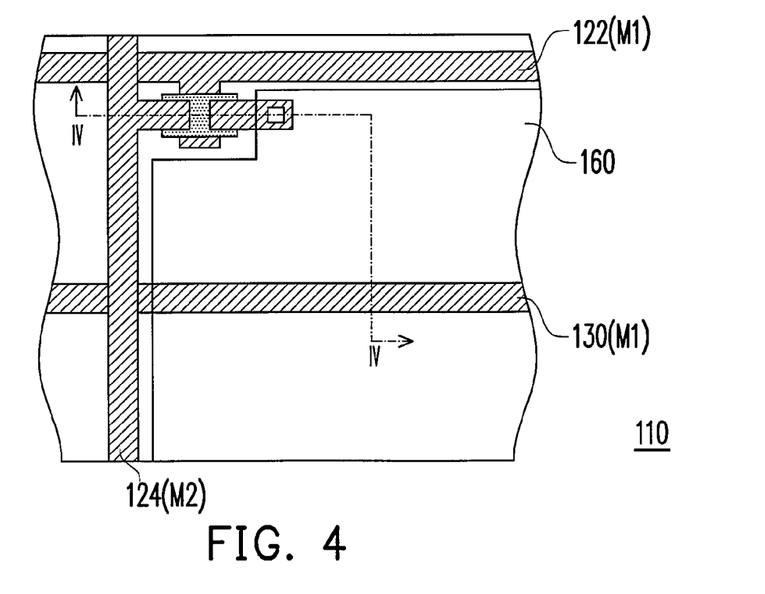
FIG. 4 is an enlarged view of a pixel of FIG. 2.
Figure 5:
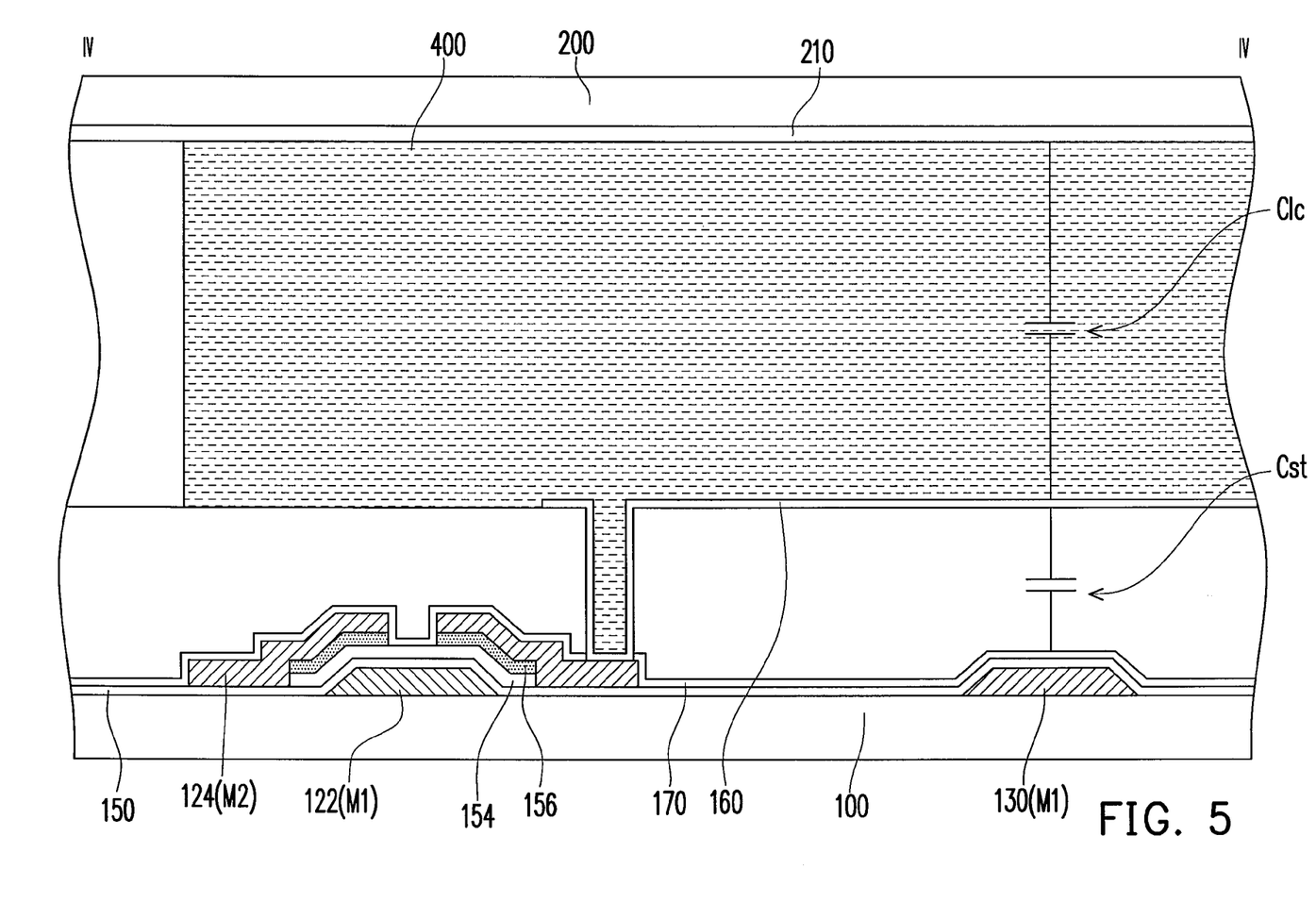
FIG. 5 is a sectional view taken along a section line IV-IV in FIG. 4.
Figure 6:
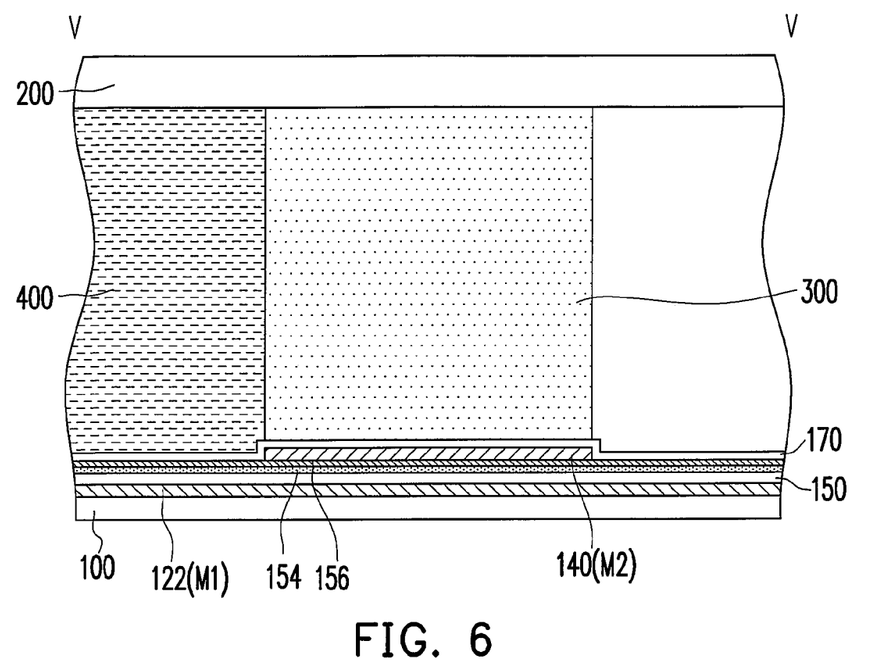
FIG. 6 is a sectional view taken along a section line V-V in FIG. 2.
Figure 7:
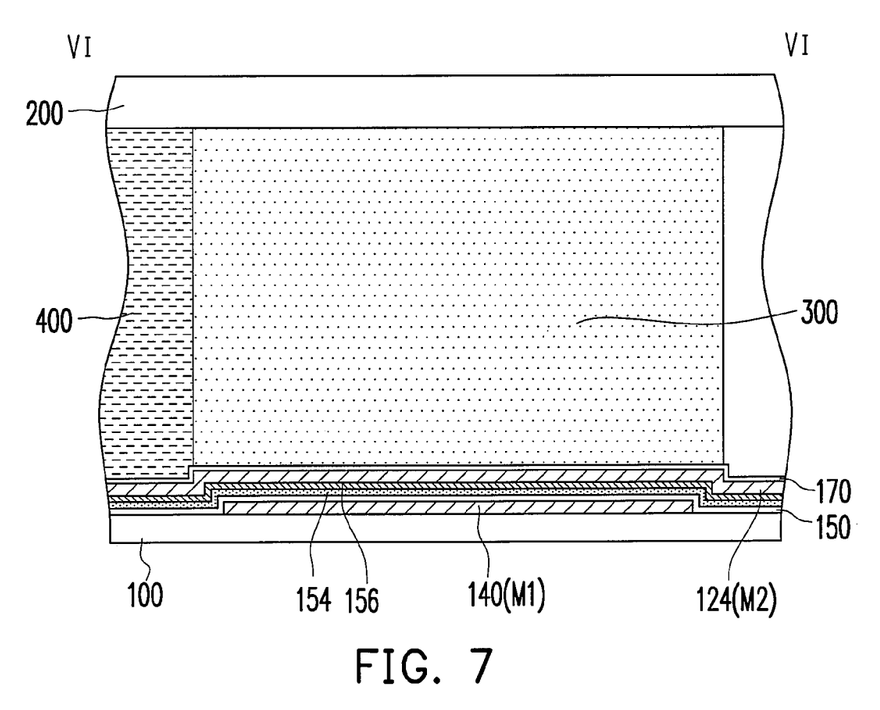
FIG. 7 is a sectional view taken along a section line VI-VI in FIG. 2.
Figure 8:
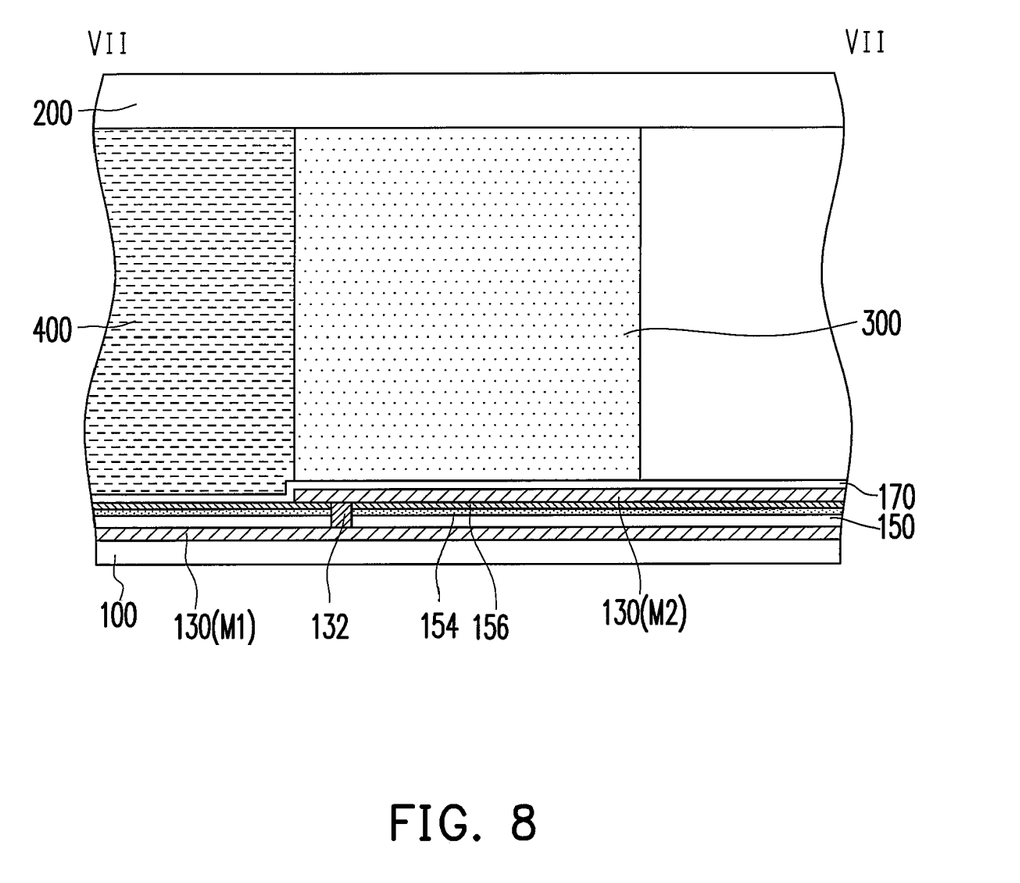
FIG. 8 is a sectional view taken along a section line VII-VII in FIG. 2.

FIG. 2 is an enlarged view of the marked region R in FIG. 1. FIG. 3 is a sectional view taken along a section line I-I or II-II in FIG. 2. FIG. 4 is an enlarged view of a pixel of FIG. 2. FIG. 5 is a sectional view taken along a section line IV-IV in FIG. 4. FIG. 6 is a sectional view taken along a section line V-V in FIG. 2. FIG. 7 is a sectional view taken along a section line VI-VI in FIG. 2. And FIG. 8 is a sectional view taken along a section line VII-VII in FIG. 2.

Referring to FIGS. 1, 2, 4, and 5, the LCD panel of the present invention includes a first substrate 100, a second substrate 200, a sealant 300, and a liquid crystal layer 400. The first substrate 100 and the components disposed on the first substrate 100 form an active device array substrate 10. The components include a plurality of pixels 110, a plurality of signal lines 120, a plurality of floating lines (not shown), and a common circuit layer 130. The active device array substrate 10 includes one display area D and one peripheral area P surrounding the display area D.

Referring to FIGS. 3, 6, and 7, all signal lines 120 of the LCD panel of the present invention include a metal film layer only, and the common circuit layer 130 includes two metal film layers. Moreover, each floating line 140 is aligned with one signal line 120 respectively. The overall thickness of the floating line 140 and the signal line 120 is the thickness of two metal film layers, and the thickness of the common circuit layer 130 is the thickness of two metal film layers as well. In addition, the sealant 300 covers the signal lines 120 or the common circuit layer 130. No matter whether the signal lines 120 or the common circuit layer 130 is covered, the sealant 300 covers two metal film layers. Therefore, the present invention enables the sealant 300 to have a uniform thickness, which will be illustrated in detail below.

The plurality of pixels 110 forms one array on the substrate 100, and is located in the display area D. The signal lines 120 are electrically connected with the pixels 110. The signal lines 120 extend from the display area D to a plurality of fan-out areas F of the peripheral area P, the floating lines 140 are disposed in the fan-out areas F, and particularly, in this embodiment, the floating lines are disposed in a part of the fan-out areas F covered by the sealant 300.

As shown in FIG. 2, the common circuit layer 130 is disposed on an area of the peripheral area P outside the fan-out areas F. In this embodiment, for example, the fan-out areas F are scattered in the peripheral area P, and are located around the display area D, and the common circuit layer 130 is disposed between every two neighboring fan-out areas F, as shown in FIG. 2. The signal lines 120 determine the average film thickness of the fan-out areas F, and the common circuit layer 130 determines the average film thickness of the region between the fan-out areas F. The aforementioned arrangement prevents the uneven interface of the peripheral area P and the sealant 300. Thus, the sealant 300 has a uniform thickness to prevent the curtain mura.

It should be noted that the uneven surface profile of the peripheral area P is caused by the fact that the average film thickness of the fan-out areas F is different from that of the area of the peripheral area P outside the fan-out areas F. The change of the film thickness in the fan-out areas F or in the area of the peripheral area P between two fan-out areas F can be ignored because the signal lines 120 and the common circuit layer 130 are disposed on the first substrate 100 compactly, and the change of the film thickness in the fan-out areas F or in the area of the peripheral area P between two fan-out areas F is not obvious.

In this embodiment, the fan-out areas F include a plurality of scan line fan-out areas Fs and a plurality of data line fan-out areas Fd, and the signal lines 120 include a plurality of scan lines 122 extending from the display area D to the scan line fan-out areas Fs and a plurality of data lines 124 extending from the display area D to the data line fan-out areas Fd. Moreover, the scan line fan-out areas Fs and the data line fan-out areas Fd are located on two neighboring sides of the display area D respectively. Taking FIG. 1 as an example, the scan line fan-out areas Fs and the data line fan-out areas Fd are located left to and above the display area D respectively because the driving chips are disposed on two neighboring sides of the display area D in this embodiment. In fact, the scan line fan-out areas Fs and the data line fan-out areas Fd can be placed at any position around the display area D.

Referring to FIGS. 2, 6, and 7, FIG. 6 is a sectional view taken along a section line V-V In this embodiment, a part of the floating lines 140 are aligned with the scan lines 122, as shown in FIG. 6. The other floating lines 140 are aligned with data lines 124, as shown in FIG. 7. The floating lines 140 can be located between the signal lines 120 and the sealant 300, or can be located between the signal lines 120 and the first substrate 100. In this embodiment, the floating lines 140 left to the display area D are located between the scan lines 122 and the sealant 300, as shown in FIG. 6. The floating lines 140 above the display area D are located between the data line 124 and the first substrate 100, as shown in FIG. 7.

Referring to FIGS. 6 and 7 again, the part of floating lines 140 in the data line fan-out areas Fd and the scan lines 122 belong to the same film layer which is defined as a first circuit layer M1. The floating lines 140 in the scan line fan-out areas Fs and the data lines 124 belong to the same film layer which is defined as a second circuit layer M2. It can be known from FIGS. 6 and 7 that the sealant 300 covers the first circuit layer M1 and the second circuit layer M2 on the peripheral area P at the same time. In addition, the signal lines 120 at the same position belong to one of the first circuit layer M1 and the second circuit layer M2. No matter whether belonging to the first circuit layer M1 or the second circuit layer M2, the signal lines 120 are not electrically connected to other film layers in any manners (e.g., contacts). Therefore, in the fan-out areas F, the ESD will not occur at specific positions of the signal lines 120, thereby preventing the damage to the signal lines 120.

Then, referring to FIGS. 2 and 3 together, in the LCD panel of the present invention, the overall thickness of the floating lines 140 and the signal lines 120 aligned therewith is equal to the thickness of the common circuit layer 130. In this embodiment, the signal lines 120, the floating lines 140, and the common circuit layer 130 are all formed by the first circuit layer M1 and the second circuit layer M2, thereby achieving the relationship of equal thickness. Moreover, the sealant 300 is bonded between the active device array substrate 10 and the second substrate 200, and the sealant 300 covers the floating lines 140 surrounding the display area D, a partial area of the signal lines 120, and a partial area of the common circuit layer 130. It can be known from the relationship of equal thickness that the sealant 300 surrounding the display area D has a uniform thickness.

In more detail, both the two circuit layer M1 and the second circuit layer M2 on the left of FIG. 3 are the common circuit layer 130. Taken along the section line I-I, the first circuit layer M1 on the right of FIG. 3 is the floating lines 140, and the second circuit layer M2 is the data lines 124. Taken along the section line II-II, the first circuit layer M1 on the right of FIG. 3 is the scan lines 122, and the second circuit layer M2 is the floating lines 140. The overall thickness of the floating lines 140 and the signal lines 120 is the overall thickness of the first circuit layer M1 and the second circuit layer M2, and the thickness of the common circuit layer 130 is the overall thickness of the first circuit layer M1 and the second circuit layer M2. Thus, the average film thickness of the fan-out areas F equals to the average film thickness of the area of the peripheral area P outside the fan-out areas F, so the sealant 300 of the peripheral area P has a uniform thickness. Therefore, the left and the above of the display area D can have even cell gaps, and the curtain mura is prevented.

Referring to FIG. 8, the common circuit layer 130 is formed by the first circuit layer M1 and the second circuit layer M2. In addition, the common circuit layer 130 of the second circuit layer M2 is electrically connected with a part of the common circuit layer 130 of the first circuit layer M1, and the electrical connection is realized, for example, by means of contacts 132. However, the present invention is not limited to this structure. In other words, the common circuit layer 130 can be a film layer other than the first circuit layer M1 and the second circuit layer M2.

Referring to FIGS. 3-8, in this embodiment, the active device array substrate 10 further includes an insulating layer 150 disposed between the signal lines 120 and the floating lines 140. The insulating layer 150 is, for example, a gate insulating layer of a thin film transistor. Moreover, referring to FIGS. 4 and 5, the pixel 110 includes a pixel electrode 160. The common circuit layer 130, the insulating layer 150, and the pixel electrode 160 of one pixel 110 form a storage capacitor Cst, and the insulating layer 150 serves as a capacitance dielectric layer of the storage capacitor Cst. In addition, the active device array substrate 10 of this embodiment further includes a passivation layer 170 covering the signal lines 120 and the floating lines 140. Under this circumstance, the passivation layer 170 and the insulating layer 150 together serve as the capacitance dielectric layer of the storage capacitor Cst.

Referring to FIGS. 1-8, the second substrate 200 is disposed above the active device array substrate 10, and the second substrate 200 can include a layer of common electrode 210. The liquid crystal layer 400 is disposed between the active device array substrate 10 and the second substrate 200, and is located in the sealant 300. As shown in FIG. 5, the pixel electrode 160, the crystal layer 400, and the common electrode 210 of the pixel 110 form a liquid crystal capacitor Clc. Moreover, generally speaking, a semiconductor layer 154 and an ohmic contact layer 156 are further disposed between the insulating layer 150 and the passivation layer 170. The functions and positions of the semiconductor layer 154 and the ohmic contact layer 156 are known to persons skilled in the art, and will not be described herein again.

To sum up, as the thickness of the sealant in the peripheral area is uniform, the LCD panel of the present invention prevents the curtain mura on the periphery of the display area of the LCD panel. Moreover, the signal lines at the same position are formed with materials of a single film layer, and will not be electrically connected with other film layers in any manner. Therefore, the ESD does not occur at specific positions of the signal lines, thereby preventing the damages to the signal lines or other electronic devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A liquid crystal display panel (LCD panel), comprising:
   an active device array substrate, having a display area and a peripheral area surrounding the display area, wherein the active device substrate comprises:
   a first substrate;
   a plurality of pixels arranged on the first substrate in an array and located in the display area;
   a plurality of signal lines electrically connected with the pixels, wherein the signal lines extend from the display area to a plurality of fan-out areas of the peripheral area;
   a plurality of floating lines disposed in the fan-out areas, wherein each of the floating lines is aligned with one of the signal lines respectively;
   an insulating layer disposed between the signal lines and the floating lines;
   a common circuit layer disposed on an area of the peripheral area outside the fan-out areas, wherein an overall thickness of the floating line and the signal line aligned therewith is equal to a thickness of the common circuit layer;
   a second substrate disposed above the active device array substrate;
   a sealant bonded between the active device array substrate and the second substrate, wherein the sealant covers the floating lines surrounding the display area, a partial area of the signal lines, and a partial area of the common circuit layer; and
   a liquid crystal disposed between the active device array substrate and the second substrate and located in the sealant.

2. The LCD panel as claimed in claim 1, wherein the fan-out areas are scattered in the peripheral area and are located around the display area, and a part of the common circuit layer is disposed between every two neighboring fan-out areas.

3. The LCD panel as claimed in claim 1, wherein the fan-out areas include a plurality of scan line fan-out areas and a plurality of data line fan-out areas, and the signal lines include a plurality of scan lines extending from the display area to the scan line fan-out areas and a plurality of data lines extending from the display area to the data line fan-out areas.

4. The LCD panel as claimed in claim 3, wherein the scan line fan-out areas and the data line fan-out areas are located on two neighboring sides of the display area respectively.

5. The LCD panel as claimed in claim 3, wherein a part of the floating lines is located between the scan lines and the sealant, and the other floating lines are located between the data lines and the first substrate.

6. The LCD panel as claimed in claim 5, wherein a part of the floating lines in the scan line fan-out areas and the data lines belong to a same film layer, and a part of the floating lines in the data line fan-out areas and the scan lines belong to a same film layer.

7. The LCD panel as claimed in claim 3, wherein the common circuit layer comprises:
 a first circuit layer, wherein the first circuit layer and the scan lines belong to a same film layer; and
 a second circuit layer electrically connected with a part of the first circuit layer, wherein the second circuit layer and the data lines belong to a same film layer.

8. The LCD panel as claimed in claim 1, wherein the floating lines are located between the signal lines and the sealant.

9. The LCD panel as claimed in claim 1, wherein the floating lines are located between the signal lines and the first substrate.

10. The LCD panel as claimed in claim 1, wherein the active device array substrate further comprises a passivation layer covering the signal lines and the floating lines.

11. A peripheral circuit structure applicable to an active device array substrate of a liquid crystal display panel (LCD panel), the active device array substrate having a display area and a peripheral area surrounding the display area, wherein the peripheral circuit structure comprises:
 a plurality of signal lines electrically connected with the pixels, wherein the signal lines extend from the display area to a plurality of fan-out areas of the peripheral area;
 a plurality of floating lines disposed in the fan-out areas, wherein each of the floating lines is aligned with one of the signal lines respectively;
 an insulating layer disposed between the signal lines and the floating lines; and
 a common circuit layer disposed on an area of the peripheral area outside the fan-out areas, wherein an overall thickness of the floating line and the signal line aligned therewith is equal to a thickness of the common circuit layer.

* * * * *